United States Patent
Wang et al.

(10) Patent No.: US 8,039,834 B2
(45) Date of Patent: Oct. 18, 2011

(54) NANOGENERATOR COMPRISING PIEZOELECTRIC SEMICONDUCTING NANOSTRUCTURES AND SCHOTTKY CONDUCTIVE CONTACTS

(75) Inventors: Zhong L. Wang, Marietta, GA (US); Xudong Wang, Atlanta, GA (US); Jinhui Song, Atlanta, GA (US); Jun Zhou, Atlanta, GA (US); Jr-Hau He, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 1096 days.

(21) Appl. No.: 11/760,002

(22) Filed: Jun. 8, 2007

(65) Prior Publication Data
US 2008/0067618 A1   Mar. 20, 2008

Related U.S. Application Data

(63) Continuation-in-part of application No. 11/608,865, filed on Dec. 11, 2006.

(60) Provisional application No. 60/813,101, filed on Jun. 13, 2006, provisional application No. 60/870,700, filed on Dec. 19, 2006, provisional application No. 60/888,408, filed on Feb. 6, 2007.

(51) Int. Cl.
*H01L 27/20* (2006.01)

(52) U.S. Cl. .......... 257/43; 257/E27.006; 977/724; 977/730; 977/811; 977/948

(58) Field of Classification Search .......... 257/43, 257/E45.001, E27.006; 977/700, 948, 701, 977/720, 721, 722, 724, 725, 730, 738, 811, 977/832, 932

See application file for complete search history.

(56) References Cited

U.S. PATENT DOCUMENTS

| | | | |
|---|---|---|---|
| 4,099,986 A | 7/1978 | Diepers | |
| 4,135,950 A | 1/1979 | Rittner | |
| 4,155,781 A | 5/1979 | Diepers | |
| 4,352,948 A | 10/1982 | Kaplow et al. | |
| 4,450,033 A | 5/1984 | Little | |

(Continued)

FOREIGN PATENT DOCUMENTS

DE   102005029162 A1   1/2007

(Continued)

OTHER PUBLICATIONS

Jeon et al., "MEMS power generator with transverse mode thin film PCT," Science Direct, vol. 122, Issue 1, Jul. 29, 2005, pp. 16-22.

(Continued)

*Primary Examiner* — Samuel Gebremariam
*Assistant Examiner* — Andrew O. Arena
(74) *Attorney, Agent, or Firm* — Bockhop & Associates, LLC; Bryan W. Bockhop

(57) ABSTRACT

A semiconducting device includes a substrate, a piezoelectric wire, a structure, a first electrode and a second electrode. The piezoelectric wire has a first end and an opposite second end and is disposed on the substrate. The structure causes the piezoelectric wire to bend in a predetermined manner between the first end and the second end so that the piezoelectric wire enters a first semiconducting state. The first electrode is coupled to the first end and the second electrode is coupled to the second end so that when the piezoelectric wire is in the first semiconducting state, an electrical characteristic will be exhibited between the first electrode and the second electrode.

7 Claims, 8 Drawing Sheets

U.S. PATENT DOCUMENTS

| | | | |
|---|---|---|---|
| 4,748,130 | A | 5/1988 | Wenham et al. |
| 6,559,550 | B2 * | 5/2003 | Herman .................. 290/1 R |
| 6,882,051 | B2 | 4/2005 | Majumdar et al. |
| 7,047,800 | B2 | 5/2006 | Thiesen et al. |
| 7,051,945 | B2 | 5/2006 | Empedocles et al. |
| 7,262,515 | B2 | 8/2007 | Pinkerton |
| 7,294,417 | B2 | 11/2007 | Ren et al. |
| 7,839,028 | B2 * | 11/2010 | Pinkerton .................. 310/10 |
| 2002/0172820 | A1 | 11/2002 | Majumdar et al. |
| 2003/0089899 | A1 | 5/2003 | Lieber et al. |
| 2003/0205657 | A1 | 11/2003 | Voisin |
| 2004/0127025 | A1 | 7/2004 | Crocker, Jr. et al. |
| 2004/0133092 | A1 | 7/2004 | Kain |
| 2005/0009224 | A1 | 1/2005 | Yang et al. |
| 2005/0188751 | A1 | 9/2005 | Puskas |
| 2005/0242366 | A1 | 11/2005 | Parikh et al. |
| 2006/0137741 | A1 | 6/2006 | Park et al. |
| 2007/0010702 | A1 | 1/2007 | Wang et al. |
| 2007/0111368 | A1 | 5/2007 | Zhang et al. |
| 2007/0151601 | A1 | 7/2007 | Jung et al. |
| 2008/0041446 | A1 | 2/2008 | Wu et al. |
| 2008/0067618 | A1 | 3/2008 | Wang et al. |
| 2008/0161796 | A1 | 7/2008 | Cao et al. |
| 2009/0309456 | A1 * | 12/2009 | Stollberg .................. 310/319 |
| 2010/0033059 | A1 * | 2/2010 | Choi et al. .................. 310/339 |
| 2010/0066208 | A1 * | 3/2010 | Choi et al. .................. 310/339 |
| 2010/0139750 | A1 * | 6/2010 | Kim et al. .................. 136/255 |
| 2010/0141095 | A1 * | 6/2010 | Park .................. 310/339 |
| 2010/0253184 | A1 * | 10/2010 | Choi et al. .................. 310/339 |

FOREIGN PATENT DOCUMENTS

| | | |
|---|---|---|
| EP | 1523019 A2 | 4/2005 |
| WO | 2006138671 A2 | 12/2006 |

OTHER PUBLICATIONS

Gao et al., Nanoarchitectures of semiconducting and piezoelectric zinc oxide, J. Applied Physics 97, 044304 (2005).

Wang et al., "Large-Size Liftable Inverted-Nanobowl Sheets as Reusable Masks for Nanolithography," Nano Letters, vol. 5, No. 9, 2005, 1748-1788.

Lao et al., "Formation of double-side teethed nanocombs of ZnO and self-catalysis of Zn-terminated polar surface," Chemical Physics Letters, Elsevier B.V., 2005.

Jeon et al., "MEMS power generator with transverse mode thin film PZT," Sensors and Actuators A Physical, Elsevier, (2005).

Lao et al., "Formation of double-side teethed nanocombs of ZnO and self-calalysis of Zn-terminated polar surface," Chemical Physics Letters (Science Direct), (Abstract), 2007.

Wang et al., "Large-Size Liftable Inverted-Nanobowl Sheets as REusable Masks for Nanolithography," Nano Letters, vol. 5, (Abstract), 2005.

Wang et al., "Piezoelectric Nanogenerators Based on Zinc Oxide Nanowire Arrays," Science, vol. 312, pp. 242-245, Apr. 14, 2006.

Peck-Radosavjevic et al., "Thrombopoietin induces rapid resolution of thrombocytopenia after orthotopic liver transplantation through increased platelet production," Blood, vol. 95, No. 3, (2000).

* cited by examiner

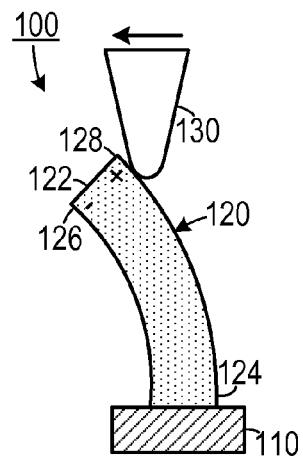 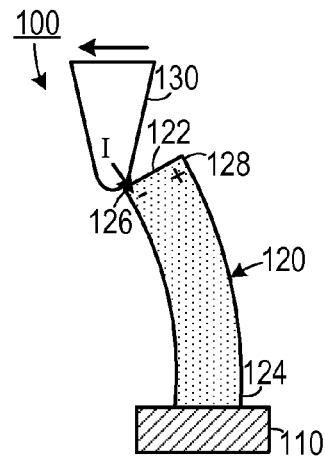
FIG. 1A  FIG. 1B
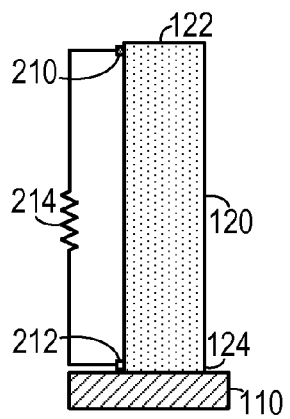 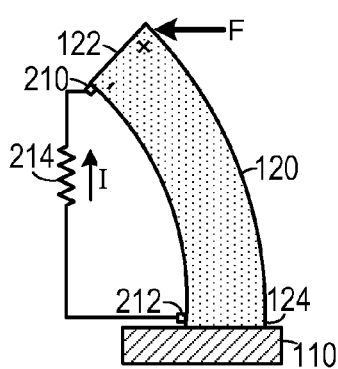
FIG. 2A  FIG. 2B
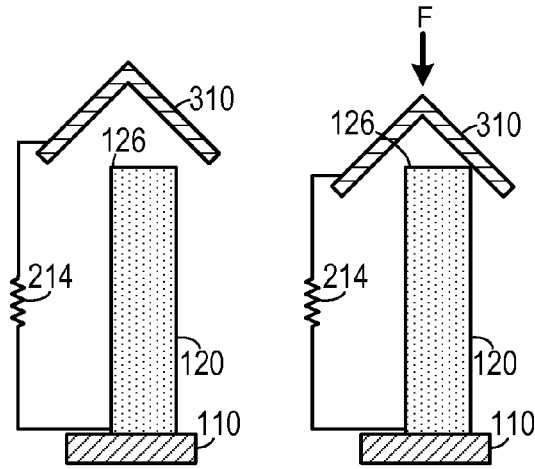 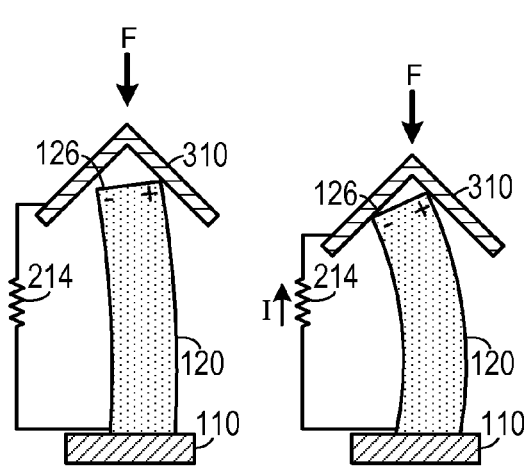
FIG. 3A  FIG. 3B  FIG. 3C  FIG. 3D

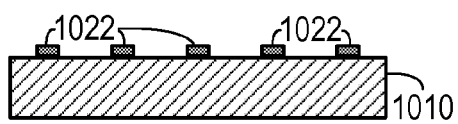 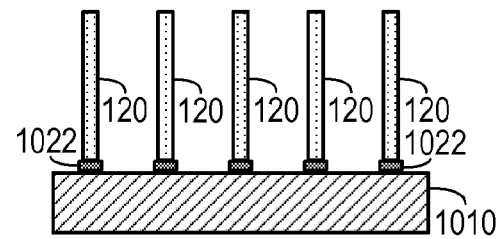
FIG. 10A          FIG. 10B
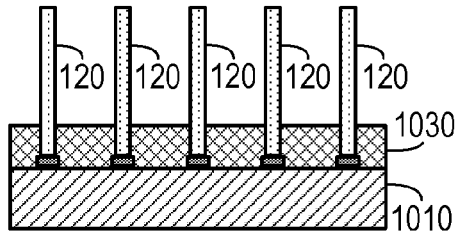 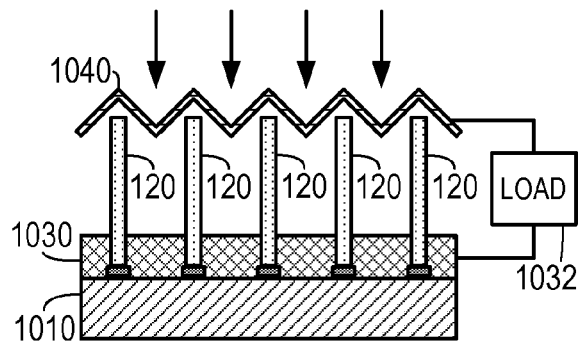
FIG. 10C          FIG. 10D
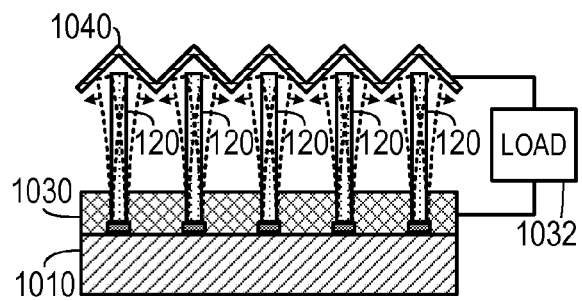
FIG. 11

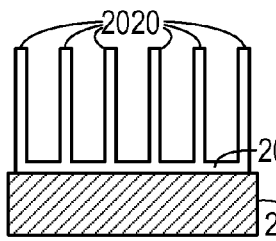
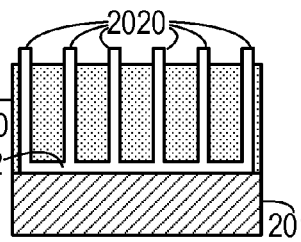
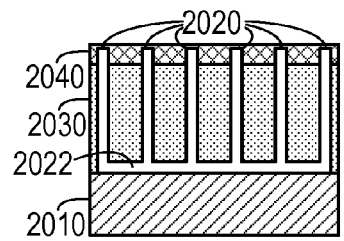
FIG. 20A    FIG. 20B    FIG. 20C
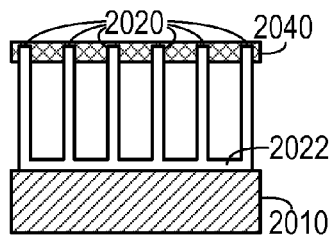
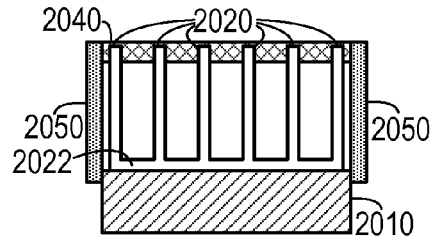
FIG. 20D    FIG. 20E
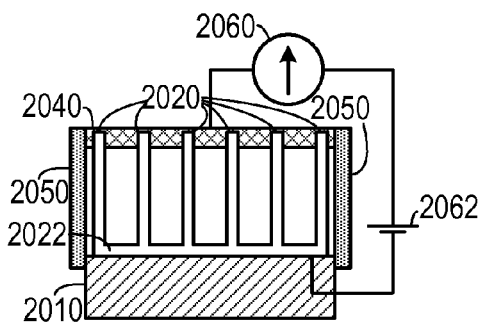
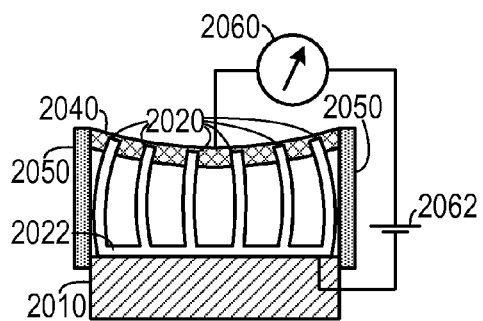
FIG. 20F    FIG. 20G

NANOGENERATOR COMPRISING PIEZOELECTRIC SEMICONDUCTING NANOSTRUCTURES AND SCHOTTKY CONDUCTIVE CONTACTS

CROSS-REFERENCE TO RELATED APPLICATION(S)

This application claims the benefit of the following U.S. Provisional Patent Applications: Ser. No. 60/813,101, filed Jun. 13, 2006; Ser. No. 60/870,700 filed on Dec. 19, 2006; and Ser. No. 60/888,408 filed on Feb. 6, 2007, the entirety of each of which is hereby incorporated herein by reference.

This application is a continuation-in-part of U.S. patent application Ser. No. 11/608,865, filed Dec. 11, 2006, which is hereby incorporated herein by reference in its entirety.

STATEMENT OF GOVERNMENT INTEREST

This invention was made with support from the U.S. government under grant number NCC3-982, awarded by NASA. The government may have certain rights in the invention.

BACKGROUND OF THE INVENTION

1. Field of the Invention

The present invention relates to electronic devices and, more specifically, to nano-scale piezoelectronic devices.

2. Description of the Prior Art

A Schottky barrier is a metal-semiconductor junction that rectifies current and, thus, may be used as a diode. A metal-semiconductor junction that does not rectify current is called an Ohmic contact. The rectifying properties of a metal-semiconductor junction depend on the metal's work function, the band gap of the intrinsic semiconductor, and the type and concentration of dopants in the semiconductor.

A piezoelectric material is one that forms an electrical potential difference between two regions of the material when the material is subjected to uneven mechanical forces. For example, when certain piezoelectric materials are bent, they develop a positive voltage in one region and a negative voltage in another region.

Many micro-scale and nano-scale machines have been proposed for such uses as in vitro medical devices. However, most of these machines are limited by the size of the power source that drives them. Specifically, many such designs rely on chemical batteries to supply electrical power to the devices. Therefore, they can be no smaller than the battery used and are useful only so long as the battery is able to provide power.

However, some of such devices need to be operational for long periods, rather than be limited by the lifespan of a battery. Also, it may be extremely difficult to change the batteries in some devices, such as environmental sensors.

Therefore, there is a need for electrical generators that are capable of providing power for long periods and that are driven by environmentally-available mechanical energy.

SUMMARY OF THE INVENTION

The disadvantages of the prior art are overcome by the present invention which, in one aspect, is a semiconducting device that includes a substrate, a piezoelectric wire, a structure, a first electrode and a second electrode. The piezoelectric wire has a first end and an opposite second end and is disposed on the substrate. The structure causes the piezoelectric wire to bend in a predetermined manner between the first end and the second end so that the piezoelectric wire enters a first semiconducting state. The first electrode is coupled to the first end and the second electrode is coupled to the second end so that when the piezoelectric wire is in the first semiconducting state, an electrical characteristic will be exhibited between the first electrode and the second electrode.

In another aspect, the invention is a biogenerator that includes an array of piezoelectric nanowires, an electrode and a fluid-tight sealant. The array of piezoelectric nanowires extends upwardly form a substrate. The electrode has a corrugated surface disposed parallel to the substrate so that the corrugated surface faces the piezoelectric nanowires. The fluid-tight sealant is disposed about a portion of the substrate, the array and the electrode so as to prevent fluids from entering the array.

In another aspect, the invention is a device for detecting both point location and point pressure of an object placed against the device that includes a substrate. A plurality of nanowires extends upwardly from the substrate. A plurality of pixilated conductive electrodes is disposed in a layer that is spaced apart from the zinc oxide nanowires. A spacer is disposed between the substrate and the plurality of pixilated conductive electrodes.

In another aspect, the invention is a method of making a semiconducting device in which a piezoelectric wire is placed on a substrate. A force is applied to the piezoelectric wire, which has a first node and a spaced apart second node. The force causes the piezoelectric wire to bend between the first node and the second node to an angle that causes the wire to enter a predetermined first semiconducting state.

In yet another aspect, the invention is a method of making a force sensor in which a plurality of aligned piezoelectric nanowires is grown to a predetermined height on a single crystal substrate. A polymer layer is spin coated onto the substrate so that the polymer layer surrounds the piezoelectric nanowires but has a thickness less than the predetermined height of the piezoelectric nanowires. A layer of a conductive material is deposited on the polymer layer so as to be in contact with the piezoelectric nanowires. The polymer layer is dissolved and removed, thereby leaving a semiconductor piezoelectric member having an outer edge. The outer edge is sealed with an insulating material. The layer of conductive material and the substrate are coupled to an electrical sensor.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

BRIEF DESCRIPTION OF THE FIGURES OF THE DRAWINGS

FIGS. 1A-1B are schematic diagrams of a first embodiment.

FIGS. 2A-2B are schematic diagrams of a second embodiment.

FIGS. 3A-3D are schematic diagrams of a third embodiment.

FIGS. 10A-10D are a series of schematic diagrams that demonstrate a method of making a sheet embodiment.

FIG. 11 is a schematic diagram showing operation of an embodiment in response to acoustic wave energy.

FIGS. 20A-20G are a series of schematic diagrams that demonstrate a method of making a force sensor.

DETAILED DESCRIPTION OF THE INVENTION

Figure 4A:
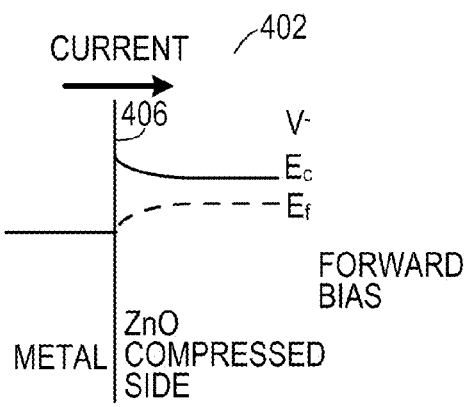
FIG. 4A is an energy band gap diagram showing the relative energy bands in a forward-biased device.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

As shown in FIGS. 1A-1B, in one embodiment of a generator 110, a semiconductor piezoelectric structure 120, having a first end 122 and an opposite second end 124, extends from a substrate 110. The semiconductor piezoelectric structure 120 could include a nanostructure, such as a nanowire, a nano-rod, a nano-belt or a nano-tube. One representative nanostructure could include a zinc oxide structure, as a zinc oxide crystal exhibits both the property of being piezoelectric and of acting as a semiconductor.

When a conductive contact 130, e.g., a probe tip of an atomic force microscope, applies a force in the direction of the arrow, the semiconductor piezoelectric structure 120 bends, thereby creating a potential difference is created between a first side 126 (which is on the compressed side of the semiconductor piezoelectric structure 120) and a second side 128 (which is on the decompressed side). When the conductive contact 130 touches the second side 128, which has a positive potential relative to the first side 126, a reverse-biased Schottky barrier is formed between the conductive contact 130 and the second side 128. Because the Schottky barrier is reverse-biased, no current flows between the conductive contact 130 and the semiconductor piezoelectric structure 120. However, as the conductive contact moves across the semiconductor piezoelectric structure 120 and reaches the first side 126 (which has a negative potential relative to the second side 128), the Schottky barrier between the conductive contact 130 and the semiconductor piezoelectric structure 120 becomes forward-biased and current is allowed to flow through the Schottky barrier.

Zinc oxide (ZnO) exhibits both semiconducting and piezoelectric properties. One embodiment of an electric generator employs aligned ZnO nanowire arrays for converting nanoscale mechanical energy into electric energy. The operating mechanism of the electric generator relies on the coupling of piezoelectric and semiconducting dual properties of ZnO as well as the rectifying function of the Schottky barrier formed between the metal tip 130 and the nanowire 120. This approach has the potential of converting biological mechanical energy, acoustic or ultrasonic vibration energy, and biofluid hydraulic energy into electricity, which may result in self-powering of wireless nanodevices and nanosystems. These embodiments employ nanowires (NWs) and nanobelts (NBs), including wurtzite structured materials (such as ZnO, GaN and ZnS) to create self-powering devices and systems (which could be built at the nanoscale).

One experimental embodiment employed mechanical manipulation of a single ZnO wire/belt 120 by a probe 130 coupled to an atomic force microscope (AFM). By selecting a long ZnO wire/belt 120 that was large enough to be seen under an optical microscope, one end of the ZnO wire was affixed on a silicon substrate by silver paste, while the other end was left free. The substrate was an intrinsic silicon, therefore its conductivity was relatively low. The wire 120 was laid horizontally on the substrate 110 (however, it was spaced apart from the substrate by a small distance to eliminate friction, except at the affixed end). The measurements were performed by an AFM using a Silicon tip coated with Platinum film, which had a tetrahedral shape with an apex angle of 70°, was 14 µm in height, and had a spring constant of 1.42 N/m. The measurements were done in AFM contact mode under a constant normal force of 5 nN between the tip and the sample surface with a scan area of 70×70 µm².

Both the topography (feed back signal from the scanner) and the corresponding output voltage (V) images across a load were recorded simultaneously when the AFM tip was scanned across a wire or a belt. The topography image reflected the change in normal force perpendicular to the substrate, which showed a bump only when the tip scans over the wire. The output voltage between the conductive tip and the ground was continuously monitored as the tip scanned over the wire or the belt. No external voltage was applied in any stage of the experiment.

The AFM tip 130 was scanned line-by-line at a speed of 105.57 μm/s perpendicular to the wire either from above the top end to the lower part of the wire or from the lower part towards the top end. For a wire with a hexagonal cross-section, three characteristic features were observed. When the tip scanned above the top end of the wire without touching the wire, the output voltage signal was nothing but noise. When the tip scanned until it touched the top end of the wire, a spark output voltage signal was observed. The output voltage is negative for the load $R_L$ for almost all of the observed cases, indicating the tip has a lower potential than the grounded silver paste. When the tip 130 scanned down along the wire 120, it deflected the wire but could not go over it, and the output voltage showed no peak but noise.

When subjected to a displacement force, one side of the nanowire 120 was stretched, and the other side was compressed. The observed results are summarized as follows: First, piezoelectric discharge was observed for both wire and belt, and it occurred only when the AFM tip touched the end of the bent wire/belt. Second, the piezoelectric discharge occurred only when the AFM tip touched the compressed side of the wire/belt, and there was no voltage output if the tip touched the stretched side of the wire/belt. Third, the piezoelectric discharge gives negative output voltage as measured from the load $R_L$. Finally, while viewing a topography image, it was noticed that the voltage output event occurred when the AFM tip was about finished crossing the width of the wire/belt 120, which means that the discharge event was delayed to the last half of the contact between the tip 130 and the wire/belt 120.

In order to explain the observed phenomena, examine the potential distribution in the wire/belt 120 based on piezoelectric induced potential distribution. Simply consider the polarization introduced in a belt as a result of elastic deformation. The relationship between strain ($\epsilon$) and the local piezo-electric field (E) is given by $\epsilon = dE$, where d is the piezoelectric coefficient. For a belt of thickness T and length L under the displacement of an external force F from the AFM tip applied perpendicularly at the top of the belt (z=L), a strain field in the belt would be formed. For any segment of the belt along its length, the local bending is described by its local curvature 1/R, R is the local radius for describing the bending of the belt, which is related to the shape of the belt by:

$$\frac{1}{R} = \frac{d^2 y}{dz^2}$$

which was from the geometrical shape of the curved belt. The shape of the belt can be described by the static deflection equation of the belt:

$$\frac{d^2 y}{dz^2} = \frac{F \cdot (L-z)}{YI}$$

where Y is the elastic modulus of the belt and I is its momentum of inertia. The local strain in the belt is given by $\epsilon = y/R$, and the corresponding electric field along the z-axis is given by:

$$E_z = \frac{\varepsilon}{d} = \frac{y}{d \cdot R}$$

This is the electric field that dominates the potential distribution under small bending approximation and the ignorance of the electric field effect on local strain via the piezoelectric effect. For simplicity, consider the potential at the two side surfaces $y = \pm T/2$ by integrating the electric field along the entire length of the belt:

$$V^{\pm} = \int E \cdot ds = \pm \int \frac{T}{2d} \cdot \frac{1}{R} \cdot ds = \pm \frac{T}{2d} \cdot \int d\theta = \pm \frac{a}{d} \cdot \theta_{max}$$

where $\theta_{max}$ is the maximum deflection angle at the top of the wire. Since:

$$V^{\pm} = \pm \frac{TFL^2}{4dYI}$$

Using the relationship between the maximum deflection $y_m$ and the applied force:

$$F = \frac{3YI y_m}{L^3}$$

the potential induced by piezoelectric effect at the stretched and compressed side surfaces, respectively, is given by:

$$V^{\pm} = \pm 3T y_m / 4Ld$$

Examining the contact between the AFM conductive tip with the stretched and compressed side surfaces of the belt shows that the compressed side of the semiconductor ZnO wire/belt 120 has negative potential $V^-$ and the stretched side has positive potential ($V^+$). This is the cause of the two distinct transport processes across the Schottky barrier at the interface, as described below. When the tip contacts the stretched side surface, the Pt metal tip has a potential of nearly zero, $V_m = 0$, the metal tip—belt interface is negatively biased for $\Delta V = V_m - V^+ < 0$. With consideration the n-type semiconductor characteristic of the as-synthesized ZnO belt, the Pt metal-ZnO semiconductor (M-S) interface in this case is a reversely biased Schottky diode, resulting in little current flowing across the interface. In this case, the piezoelectric static charges, mainly due to $Zn^{2+}$ and $O^{2-}$ ions, are accumulated and preserved, but without creating a current flow through the belt. This is a key process that prevents the slow "leakage" of the current as the deformation is being built up by the tip, otherwise, no observable output electric signal in the next step. As the tip continues to scan and touches the compressed side of the belt, the metal tip—belt interface is positively biased for $\Delta V = V_L = V_m - V^- > 0$. The interface is thus a positively biased Schottky diode, and it is possible to have current flow from the tip through the belt 120. The flow of electrons is to neutralize the piezoelectric ionic charges distributed in volume, resulting in a sudden increase in the output electric current. The output voltage measured on the load is negative in reference to the grounded root of the belt with consideration the flowing direction of the current.

The elastic deformation energy as created by the displacement force F is mainly dissipated in three ways: creating mechanical resonance/vibration after releasing the belt 120, generating piezoelectric discharge energy for each cycle of the vibration, and overcoming the friction and viscosity, if any, from the environmental and substrate. The mechanical resonance of the belt 120 may continue for many cycles, but it is eventually damped by the viscosity of the medium. The piezoelectric voltage output is generated in each cycle of the vibration, but the AFM tip 130 in the experimental design may be too slow to collect the electric signal output from each cycle of the belt vibration. It was found that the discharge signal can sometimes be collected for an extensive period of time, during which the belt may have resonated for over 10 cycles, producing a continuous and constant output DC voltage. As the resonance frequency of the wire was about 10 KHz, and the scanning speed of the tip was about 10 μm/s, it is feasible that the wire 120 had contacted the AFM probe tip 130 over 100 times before it departed to the point that it was too far away to make contact. It was observed that a piezoelectric output voltage is created in each cycle of vibration. Thus a DC power source can be created by continuously collecting the output voltage.

There is current flow only when the AFM tip 130 is in contact with the compressed side of the belt/wire. If the AFM probe tip 130 contacts the stretched side 128, no output current is possible even under extremely large elastic deformation. This expected result was observed where a ZnO wire was subjected to a large deformation, but no output voltage was received.

By deflecting a wire/belt 120 using a conductive AFM tip 130 in contact mode, the energy was first created by the deflection force and stored by piezoelectric potential, and later converted into piezo-electric energy. The mechanism of the generator is the result of coupled semiconducting and piezoelectric properties of ZnO. The piezoelectric effect is required to create electric potential of ionic charges from elastic deformation; the semiconducting property is required to preserve the charges and then release the potential via the rectifying behavior of the Schottky barrier at the metal-ZnO interface, which serves as a switch in the entire process. The good conductivity of ZnO makes current flow possible. This process may also be possible for wurtzite structured materials such as GaN and ZnS.

A second embodiment of a generator is shown in FIGS. 2A and 2B, in which a first conductive contact 210 is disposed at the first end 122 and a second conductive contact 212 is disposed at the second end 124. The second conductive contact 212 could be either placed against the semiconductor piezoelectric structure 120 or placed against the substrate 110 if the substrate 110 is made of a conductive material. A load 214 is coupled between the first conductive contact 210 and the second conductive contact 212 so that when a force is applied to the first end 122 in direction F, a current I flows through the load 214.

A third embodiment is shown in FIGS. 3A-3D. In this embodiment, the first conductive contact 310 has an uneven surface. As a downward force is applied to the first conductive contact 310, as shown in FIG. 3B, part of the semiconductor piezoelectric structure 120 makes contact with the first conductive contact 310. This causes the semiconductor piezoelectric structure 120 to bend and a potential difference forms between the two sides of the semiconductor piezoelectric structure 120. Initially, as shown in FIG. 3C, only the positive side of the semiconductor piezoelectric structure 120 is in contact with the first conductive contact 310, which creates a reverse-biased Schottky barrier through which no current flows. However, once the first conductive contact 310 has been pushed down far enough, the negative side of the semiconductor piezoelectric structure 120 makes contact with the first conductive contact 310, thereby forming a forward-biased Schottky barrier and allowing current to flow through the load 214. The fact that the positive side of the semiconductor piezoelectric structure 120 may still be touching the first conductive contact 310 makes no difference since the Schottky barrier between the positive side and the first conductive contact 310 is still reverse-biased and, therefore, no current will flow through the positive side.

Figure 4B:
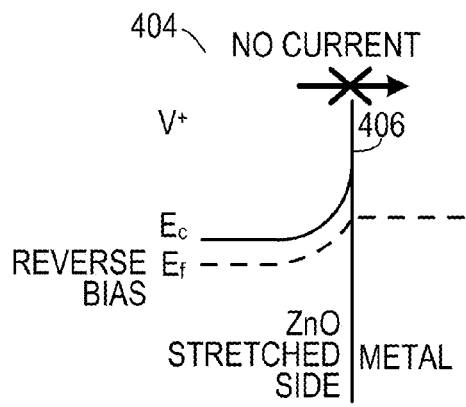
FIG. 4B is an energy band gap diagram showing the relative energy bands in a reverse-biased device.

The device in the forward-biased state has an energy band gap diagram 402 as shown in FIG. 4A, in which the conduction energy level ($E_c$) of the compressed side of the semiconductor piezoelectric structure (which is ZnO in the example presented) is greater than the Fermi energy ($E_f$) of the metal. Given that a negative potential ($V^-$) exists between the metal and the compressed side, current is able to flow from the metal to the semiconductor piezoelectric structure (using the convention that current represents the flow of charge from positive to negative) across the Schottky barrier 406. When the metal is in contact with the stretched side of the semiconductor piezoelectric structure, as shown in FIG. 4B, the conduction energy level ($E_c$) of the compressed side is not greater than the Fermi energy ($E_f$) of the metal and, since the stretched side has a positive potential relative to the potential of the metal, current is not allowed to flow across the Schottky barrier 406.

Figure 5A:
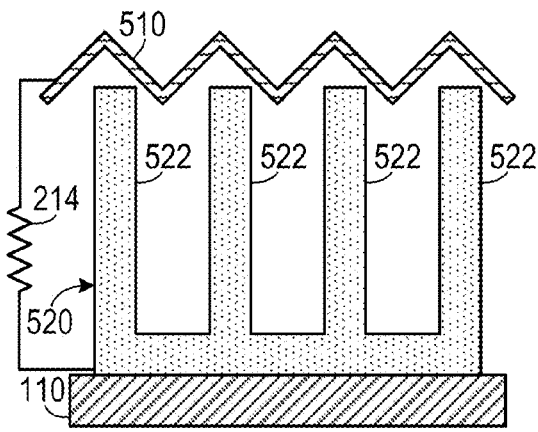
FIG. 5A is a schematic diagram of one embodiment.
Figure 5B:
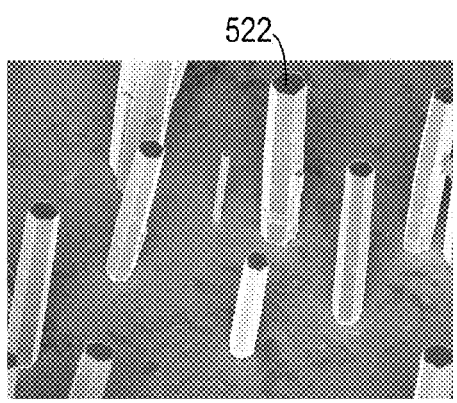
FIG. 5B is a micrograph of a plurality of nanostructures of a type that may be employed in the embodiment shown in FIG. 5A.
Figure 6A:
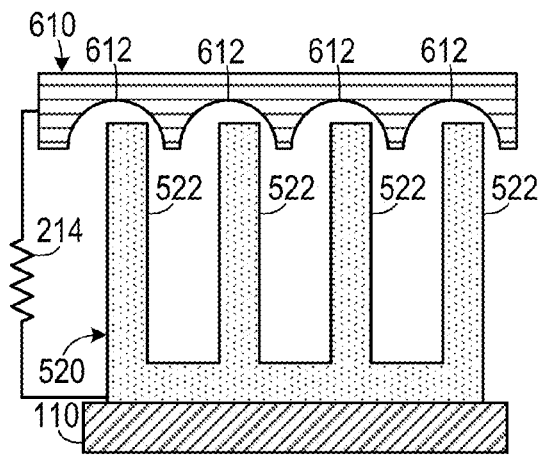
FIG. 6A is a schematic diagram of an embodiment employing nano-bowls.
Figure 6B:
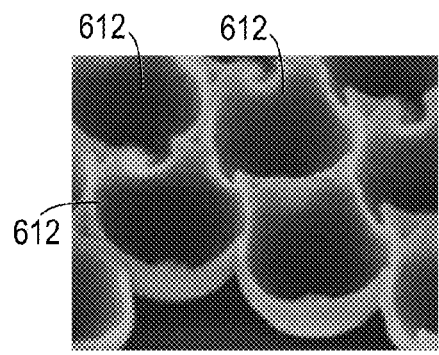
FIG. 6B is a micrograph of a plurality of nano-bowls of a type that may be employed in the embodiment shown in FIG. 6A.

One embodiment, as shown in FIG. 5A, employs an array 520 of zinc oxide (ZnO) nanostructures 522 with a corrugated conductor 510 placed above the nanostructures 522. A load 214 is coupled to the base of the nanostructure array 520 (forming an Ohmic contact therebetween) and to the corrugated conductor 510. A micrograph of suitable ZnO nanostructures 522 is shown in FIG. 5B. In an alternate embodiment, as shown in FIG. 6A, a sheet 610 defining a plurality of nano-bowls 612 is used as the conductive contact. A micrograph of a plurality of nano-bowls 612 is shown in FIG. 6A. Suitable nano-bowls may be fabricated according to a method disclosed in detail in U.S. Patent Application Publication No. US-2005-0224779-A1 (Ser. No. 11/010,178, filed on Dec. 10, 2004), the entirety of which is incorporated by reference herein. This embodiment could be employed in generating electricity from body movement. For example, this embodiment could be applied to the soles of a pair of shoes to generated electricity while the person wearing the shoes walks.

Figure 7:
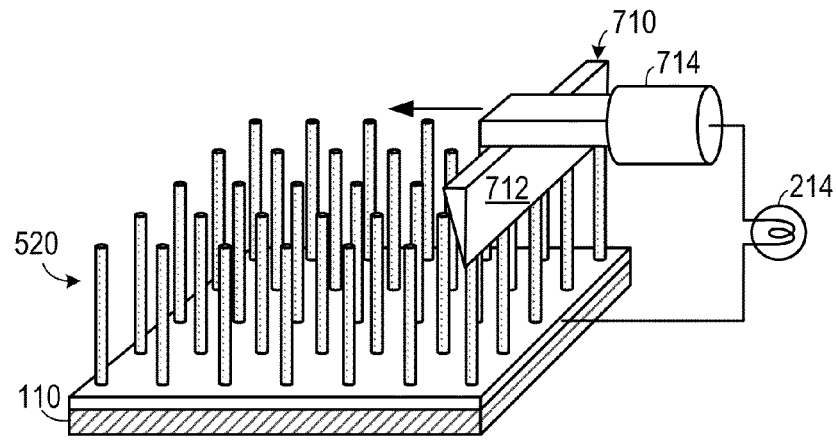
FIG. 7 is a schematic diagram of an embodiment that employs a reciprocating blade.

An embodiment that employs an array of nanowires 520 that are activated by a reciprocating contact 710 is shown in FIG. 7. The reciprocating contact 710, which is coupled to a load 214, includes a metal contact blade 712 that is driven by an actuator 714, such as a piston-type actuator.

Figure 8A:
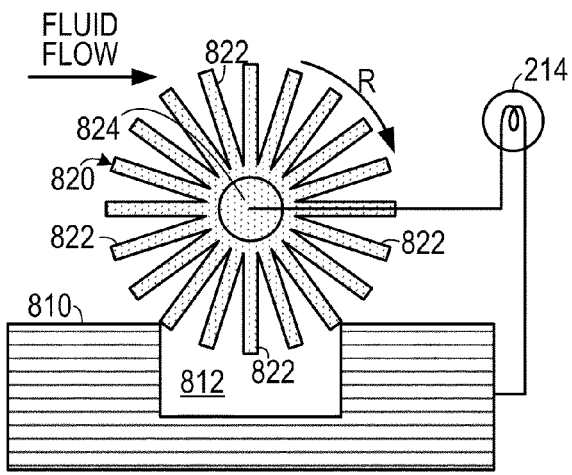
FIG. 8A is a schematic diagram of a rotational embodiment.
Figure 8B:
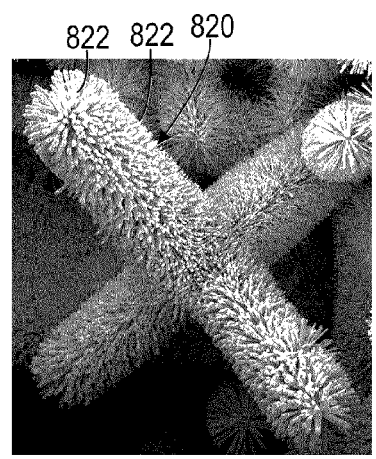
FIG. 8B is a micrograph of radially-disposed nanostructures of a type that may be employed in the embodiment shown in FIG. 8A.

A rotating generator is shown in FIG. 8A, in which a semiconductor piezoelectric structure 820 includes a plurality of nanorods 822 extending radially from a core 824 and that is capable of rotating about an axis in rotational direction R. The conductive contact 810, which is coupled to a load 214, defines an opening 812 that is disposed so that as the nanorods 822 are drawn against edges of the contact 810 as the semiconductor piezoelectric structure 820 rotates. In this embodiment, flowing fluid can cause the semiconductor piezoelectric structure 820 to rotate much in the way that a windmill rotates. This embodiment could be used as a generator within fluid flow structures, such as a blood vessel or a water pipe.

Figure 9A:
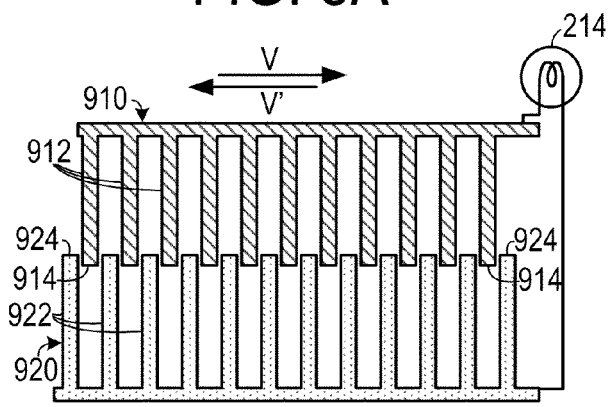
FIG. 9A is a schematic diagram of an embodiment employing two sets of nanowires.
Figure 9B:
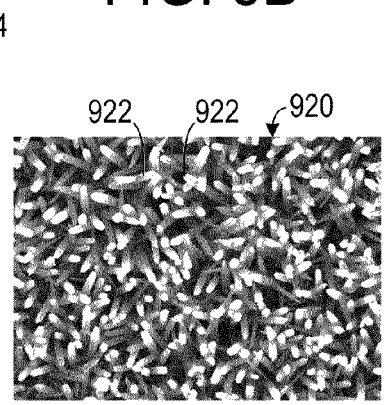
FIG. 9B is a micrograph of a plurality of nanowires of a type that may be employed in the embodiment shown in FIG. 9A.

An embodiment for converting vibrational energy into electrical energy is shown in FIG. 9A, in which an array 920 of semiconductor piezoelectric nanostructures 922 is placed in an opposing relationship to an array 910 of conductive nanorods 912, and is coupled thereto via a load 214. A first end 924 of at least some of the semiconductor piezoelectric nanorods 922 is adjacent to a first end 914 of at least some of a set of the conductive nanorods so that as the conductive nanorods 912 vibrate laterally (in directions V and V') with respect to the semiconductor piezoelectric nanorods 922, a forward-biased Schottky barrier is formed by contact of at least one of the conductive nanorods 912 and at least one of the semiconductor piezoelectric nanorods 922, thereby generating an electrical current. A micrograph of an array 920 of semiconductor piezoelectric nanorods 922 is shown in FIG. 9B.

In one method of making a generator, as shown in FIGS. 10A through 10D, a plurality of catalyst particles 1022 (such as gold particles) is placed on a substrate 1010. Zinc oxide nanowires 120 are then grown from the catalyst particles 1022 using a process of the type disclosed in U.S. Patent Application Publication No. US-2005-0224779-A1. A deformable layer 1030, such as a layer of an organic polymer, is deposited onto the substrate 1010 to a level so that the deformable layer 1030 surrounds each of the plurality of zinc oxide semiconductor piezoelectric structures 120 to a predetermined level. An uneven conductive contact layer 1040 is placed above the nanowires 120 so that as a downward force (in the direction of the arrows) is applied to the conductive contact layer 1040, forward-biased Schottky barriers are formed (in the manner discussed with reference to FIGS. 3A-3D) and a current is applied to the load 1032. In this embodiment, the deformable layer 1030, maintains the attitude of the nanowires 120, keeps them separated and prevents them from peeling off of the substrate 1010.

This embodiment may be subjected to extremely large deformation, so that they can be used for flexible electronics as a flexible or foldable power source. One reason for choosing zinc oxide in this embodiment is that it is a biocompatible and bio-safe material and, thus, it has a potential for being implanted as a power source in the human body. The flexibility of the polymer substrate used for growing zinc oxide nanowires makes it feasible to accommodate the flexibility of human muscles so that it can use mechanical energy (body movement, muscle stretching) in the human body to generate electricity.

The embodiment shown in FIGS. 10A-10D may also respond to acoustic wave or ultrasonic wave energy, as shown in FIG. 11. Resonance of the nanowires 120 as a one-end free beam can also generate electricity.

The principles and technology demonstrated here have the potential of converting mechanical movement energy (such as body movement, muscle stretching, blood pressure), vibration energy (such as acoustic/ultrasonic wave), and hydraulic energy (such as flow of body fluid, blood flow, contraction of blood vessel, dynamic fluid in nature) into electric energy that may be sufficient for self-powering nanodevices and nanosystems. The technology could have important applications in wireless self-powered nanodevices by harvesting energy from the environment. It may also provide a method for indirectly charging of a battery. It may be possible to fabricate large-power output electric generator by using arrays of ZnO wires/belts, which can be grown on substrates such as metal foils, flexible organic plastic substrates, ceramic substrates (such as alumina) and compound semiconductors (such as GaN and AlN). The nano-generator could be the basis for using self-powering technology for in-situ, real-time and implantable biosensing, biomedical monitoring and biodetection. It could have the potential of solving key energy requirement for remote sensing and actuating.

Figure 12:
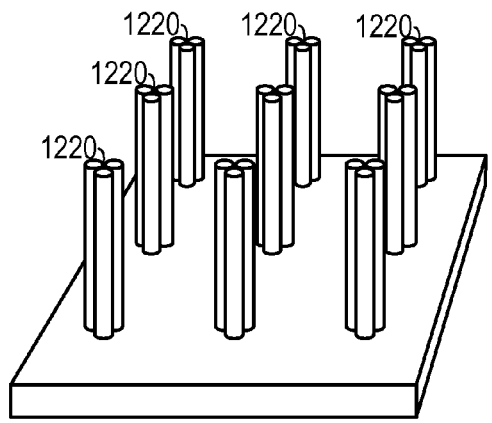
FIG. 12 is a top perspective view of a first patterned nanostructure embodiment.
Figure 13:
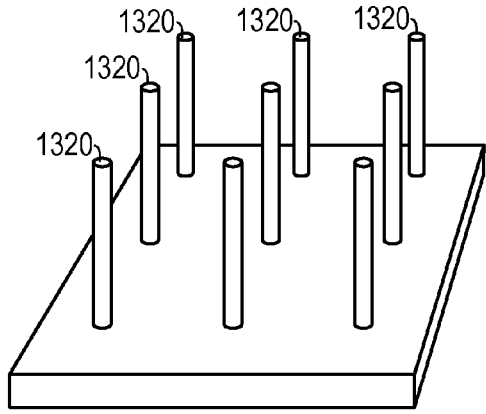
FIG. 13 is a top perspective view of a second patterned nanostructure embodiment.
Figure 14:
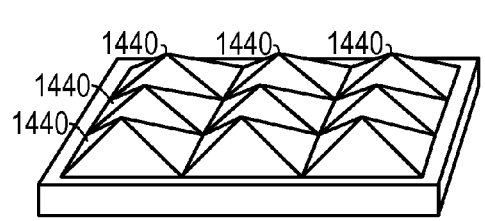
FIG. 14 is a top perspective view of a pyramidal conductive contact embodiment.

In one embodiment, as shown in FIG. 12, the nanostructures could be patterned in clusters 1220 or, as shown in FIG. 13, individual nanostructures 1320 arranged in a pattern. In one embodiment, as shown in FIG. 14, the conductive contact could include an array of conductive pyramids 1440.

Figure 15A:
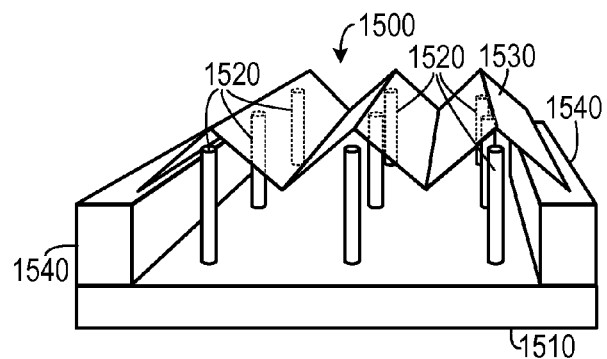
FIG. 15A us a top perspective view of one embodiment of a nano-generator.
Figure 15B:
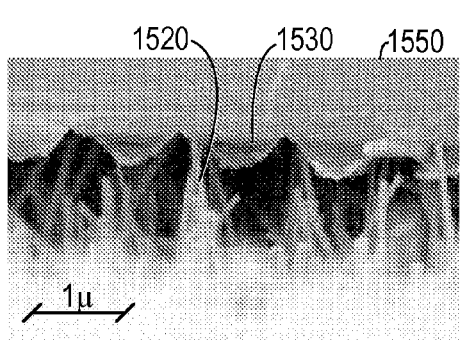
FIG. 15B is a micrograph of a nano-generator according to FIG. 15A.

In one experimental embodiment of a nanogenerator 1500, shown in FIGS. 15A-15B, an array of aligned ZnO nanowires 1520 was covered by a corrugated electrode 1530 that included a silicon structure coated with platinum. Force applied to the silicon structure is conveyed to the nanowires 1520, causing them to bend. The platinum coating not only enhanced the conductivity of the electrode platinum 1530 but also created a Schottky contact at the interface with ZnO nanowires 1520. The nanowires 1520 were grown on either GaN or sapphire substrates that were covered by a thin layer of ZnO film, which served as a common electrode for directly connecting with an external circuit. The density of the nanowires 1520 was approximately $10/\mu m^2$, with heights of approximately 1.0 μm and diameters of approximately 40 nm. The top electrode is composed of parallel zigzag trenches fabricated on a (001) orientated Si wafer and coated with a thin layer of Pt (200 nm in thickness). The electrode 1530 was placed above the nanowires 1520 and manipulated by a probe station under an optical microscope to achieve precise positioning; the spacing was controlled by soft polymer film strips 1540 sandwiched in-between at the four sides (only two of which are shown for simplicity.

The resistance of the nanowires 1500 was monitored during the assembling process to ensure a reasonable contact between the nanowires 1520 and the electrode 1530 by tuning the thickness of the polymer film strips 1540. Then the nanogenerator 1500 was sealed at the edges to prevent the penetration of water/liquid.

Figure 15C:
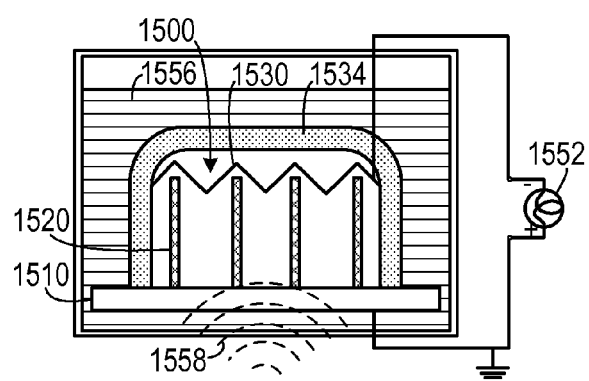
FIG. 15C is a schematic diagram of a fluid-tight embodiment of a nano-generator.

The packaged device, as shown in FIG. 15C, was supported by a metal plate, which was direct in contact with water 1556 contained in the cavity of an ultrasonic generator 1558. The operation frequency of the ultrasonic wave was around 41 KHz. The output current and voltage were measured by an external circuit at room temperature.

When subject to the excitation of an ultrasonic wave, the zigzag electrode would move downwardly and push onto the nanowires 1520, which resulted in a lateral deflection of the nanowires 1520, creating a strain field across the width of each nanowire 1520, with the nanowire's 1520 outer surface being in tensile and its inner surface in compressive strain. The inversion of strain across the nanowire 1520 resulted in an inversion of piezoelectric field $E_z$ along the nanowire 1520, which produced a piezoelectric potential inversion from $V^-$ (negative) to $V^+$ (positive) across the nanowire 1520. When the electrode made contact with the stretched surface of a nanowire 1520, which had a positive piezoelectric potential, the Pt metal-ZnO semiconductor interface became a reversely biased Schottky barrier, resulting in little current flowing across the interface. With further pushing of the electrode, the bent nanowire 1520 would reach the other side of the adjacent tooth of the zigzag electrode 1530, which was also in contact with the compressed side of the nanowire, where the metal-semiconductor interface was a forward biased Schottky barrier. This resulted in a sudden increase in the output electric current flowing from the top electrode into the nanowire 1520, which is a discharge process.

The nanowires 1520 producing current in the nanogenerator are equivalent to a voltage source $V_s$ plus an inner resistance $R_i$ that also contains the contact resistance between the active nanowires 1520 and the electrode 1530. On the other hand, there are a lot of nanowires 1520 that are in contact with the electrode 1530 but cannot be bent or move freely; thus, they do not actively participate in the current generation but they do provide a path for conducting current. These nanowires 1520 are simply represented by a resistance $R_w$ that is parallel to the portion that generates power. A resistance $R_c$ is introduced to represent the contact resistance between the electrode 1530 and an external measurement circuit. The capacitance in the system is ignored in the circuit for simplifying modeling of DC measurement.

Figure 15D:
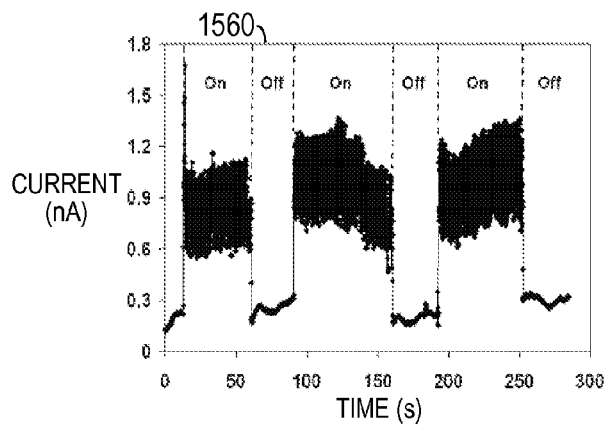
FIG. 15D is a current chart showing current generated with the nano-generator shown in FIG. 15B.

The current output 1560 of the nanogenerator 1500 is shown in FIG. 15D, with the ultrasonic wave being turned on and off regularly. A current jump was observed when the ultrasonic wave generator (not shown) was turned on, and the current immediately fell back to the baseline once the ultrasonic wave generator was turned off.

The output electricity of the nanogenerator 1500 was continuous and reasonably stable. The output current was in the nano-Ampere range. The current signal showed no direct coupling with the frequency of the ultrasonic waves being applied, because the wave frequency was approximately 80 times less than the resonance frequency of the current generated by the nanogenerator 1500. The size of the nanogenerator was approximately 2 mm² in effective substrate surface area. The number of nanowires 1520 that were actively contributing to the observed output current was estimated to be 250-1000. The nanogenerator 1500 worked continuously for an extended period of time of beyond one hour.

This experimental design was tested in comparison to the experiments conducted using different materials or configurations. Using the design shown in FIG. 15A, but replacing the ZnO nanowire array with an array of carbon nanotubes (CNTs), no jump in current was observed when the ultrasonic wave was turned on. This was because CNTs are not piezoelectric. Similarly, using a ZnO nanowire array, but using a flat (not zigzagged) top electrode that totally covered the tips of the nanowires, also resulted in no jump in output current.

Figures 16A, 16B:
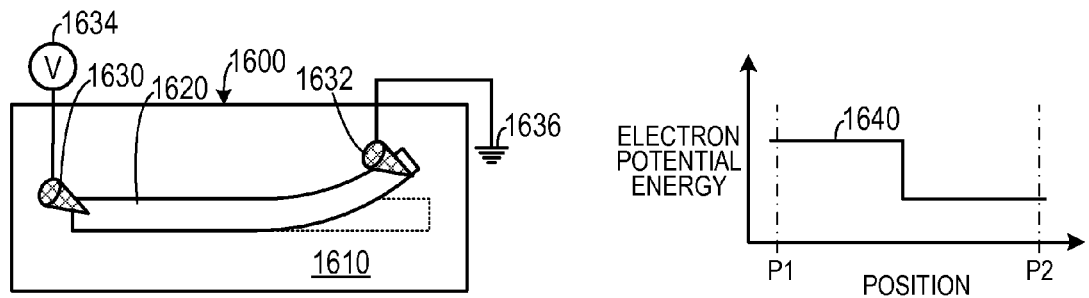
FIG. 16A is a schematic diagram of a nanowire configured to act as a diode.
FIG. 16B is a potential energy chart showing electron potential energy as a function of position in relation to the nanowire shown in FIG. 16A.

In one embodiment, shown in FIG. 16A, an n-type ZnO nanowire 1620 can be used to produce a p-n junction that serves as a diode 1600 by placing the nanowire 1620 on a substrate 1610, holding a first end in place with a first conductive nano-probe tip 1630 and bending an opposite second end of the nanowire 1620 with a second conductive nano-probe tip 1632 that remains in contact with the expanded side of the nanowire 1620. If a voltage source 1634 is coupled to the first tip 1630, then current will flow through the nanowire 1620 into the second tip 1632 into a common voltage 1636.

This design is based on mechanical bending of a ZnO nanowire 1620. As a result, the potential energy barrier induced by piezoelectricity ($\psi_{PZ}$) across the bent nanowire 1620 governs the electric transport through the nanowire 1620. To quantify $\psi_{PZ}$, the current-voltage (I-V) characteristics received at different level of the deformation were tied in with theoretical calculation. The magnitude of the piezoelectric barrier dominates rectifying effect. The rectifying ratio could be as high as 8.7:1 by simply bending a nanowire 1620. The operation current ratio of straight and bent ZnO nanowire could be as high as 9.3:1 at reverse bias. It also shows that the nanowire 1620 can serve as a random access memory (RAM) unit.

The phase of nanowires 1620 is hexagonal quartzite-structured ZnO. The growth direction of ZnO nanowire was determined to be [0001].

In one experimental embodiment, the performance of in situ I-V measurements and the manipulation of ZnO nanowires 1620 were carried out in a multi-probe nano-electronics measurement (MPNEM) system. The two-terminal method was applied for electrical transport measurements at high vacuum to minimize the influences from the environment. The W nano-tip used for measuring the electrical transport of a nanowire was pre-coated with a Ti/Au (30 nm/30 nm) film by electron beam evaporation for obtaining ohmic contact between Ti and ZnO. Creating ohmic contact is a key step for the measurements. Focusing the nanowire and the W nano-tip in the MPNEM system simultaneously in the same focal plane guaranteed that they were contacted and placed at the same height on the surface of the $Si_3N_4$ layer.

The first nano-tip 1630 is used to apply voltage from the voltage source 1634 and measure the current through the nanowire 1620. By controlling lateral and longitudinal motions of two nano-tips 1630 and 1632 with highly sensitive probing techniques, the manipulation of nanowire 1620 and its I-V measurements were carried out in situ in the SEM. For eliminating the effect from the electron beam in the SEM, the electron beam of the SEM was turned off when measuring I-V. The I-V characteristics were measured by sweeping the voltage from −5 to 5 V. After the measurement, the electron beam was turned on again to ensure the preservation of shape and position of the nanowire. Then the nanowire was bent further by moving upper nano-tip under direct imaging condition. At the first contact of the nanowire 1620 with the second tip 1632, the nanowire 1620 was already bent a little because a pushing force was necessary for a good electrical contact. The corresponding linear and symmetric I-V characteristic shows that the Ti/Au to ZnO nanowire 1620 is an ohmic contact instead of a double (back-to-back) Schottky contact. As the bending proceeded, the electric current dropped significantly with negative bias, exhibiting the asymmetric I-V behaviors with the increased strain. The nano-tips 1630 and 1632 were firmly attached to the nanowire 1620 without sliding, indicating the contacts was well retained during bending process and should not cause any change in contact resistance or contact area under bending process. The reverse current dropped severely at reverse bias voltage when the nanowire 1620 was bent further. When the nanowire 1620 was under significant bending, the reverse current at −5 V bias could be as low as ~6.6 μA and the rectifying ratio at ±5 V was up to 8.7:1 . Due to large elasticity of the nanowire 1620, the measurements of these devices are reversible. The details in electric current at reverse bias and rectifying ratio at ±5 V under continuously changing bending curvature are listed in Table 1 below. The potential energy barrier height induced by piezoelectricity will be discussed in details later. The ZnO nanowire under bending shows certain rectifying I-V characteristics, similar to the result of a p-n junction. The substantial bending of nanowire and absence of symmetric I-V characteristic suggest that electric transport in nanowire may be governed by an internal field created by bending.

TABLE 1

| | Measurement stage | | | |
|---|---|---|---|---|
| | #1 | #2 | #3 | #4 |
| I at −5 V (μA) | −61.4 | −42.0 | −21.3 | −6.6 |
| Rectifying ratio | 1:1 | 1.6:1 | 2.8:1 | 8.7:1 |
| Piezoelectric potential energy barrier (meV) | X | 9.82 | 27.37 | 57.66 |

A bent ZnO nanowire 1620 can produce an piezoelectric electric field ($E_{pz}$) along and across the nanowire due to strain induced piezoelectric effect. The discussion on observed phenomena is for illustrating the physical process and principle rather than a rigorous numerical calculation. Considering the piezoelectric effect introduced in a single nanowire 1620 as a result of elastic deformation, for a simulated case in a nanowire 1620 of ~490-nm thickness and 21-μm length under the displacement of an external force F from the nano-tip 1632 applied at the surface of nanowire 1620, the deflection of the ZnO nanowire 1620 creates a strain field. The outer surface is stretched (positive strain ϵ) and the inner surface is compressed (negative ϵ) at the area contacting with nano-tip. The magnitude of the deflection increases with the increase of degree of bending, resulting in an increase of strain field. An electric field $E_{pz}$ along the nanowire is then created inside the nanowire through the piezoelectric effect, $E_{pz}=\epsilon/d$ where d is the piezoelectric coefficient. The piezoelectric field direction is closely parallel to the nanowire 1620 direction (z-axis) at the outer surface and antiparallel to the z-axis at the inner surface. With the increase of the bending of the nanowire 1620, the density of the piezoelectric charges on the surface also increases. The potential is created by the relative displacement of the $Zn^{2+}$ cations with respect to the $O^{2-}$ anions, a result of the piezoelectric effect in the wurtzite crystal structure. Thus, these ionic charges cannot freely move and cannot recombine without releasing the strain. The potential difference is maintained as long as the deformation is in place.

Assuming that before bending, there is no energy barrier but contact resistance between Ti and ZnO, then the nano-tip 1632 pushes a nanowire 1620 and bents it and a positive potential is produced at the stretched side of the nanowire 1620 due to piezoelectric effect. As a result, an energy barrier is produced at the interface between the tip 1632 and the nanowire 1620 with the nanowire 1620 being at the higher potential. The actual potential distribution is not fixed due to the nonuniform distribution of strain. However, for the ease of comprehension, the potential distribution may be simplified. As shown in FIG. 1B, which is a plot 1640 of electron potential energy as a function of location on the nanowire, for the bent ZnO nanowire 1620 under forward bias, the electrons have not been blocked by this energy barrier. On the other hand, under reverse bias, electrons need to overcome the energy barrier resulted from piezoelectric electric field. This energy diagram corresponds well to the result of electric transport measurements on bent ZnO. Such an energy barrier is effectively served as a p-n junction barrier at the interface that resists the current flow from the tip to the nanowire 1620, but current can flow from the nanowire 1620 to the tip 1632. The magnitude of the barrier increases with the increase of degree of bending, resulting in a drastic increase of rectifying effect due to piezoelectric potential energy barrier. This is a simple piezoelectric gated diode. To quantify the barrier height produced by piezoelectricity, here it is assumed that electric current also follows the typical I-V characteristics of diode. The reverse current is $$I=Ae^{-\psi_{PZ}/kT}(e^{eV/kT}-1),$$

where $\psi_{PZ}$ is potential energy barrier resulted from piezoelectricity, $I_S$ is the reverse saturation current, V the applied voltage, k the Bolzmann's constant ($8.617\times10^{-5}$ eV/T), T the absolute temperature and A constant. Considering electric current at −5 voltages and room temperature with bending degree, the above equation could be simplified as follows since ($e^{eV/kT}-1$) term is a constant.

$$I=A*e^{-\psi_{PZ}/kT},$$

where A* is constant. Assume that current is 61.4 μA as $\psi_{PZ}$ is zero where there is no deflection observed (Table 1), A* is determined to be 61.4 μA. Therefore, by the given electric current from Table 1, this could lead to an estimation of $\psi_{PZ}$ to be ~9.82 meV for sequence #2 and 27.37 meV for sequence #3 and 57.66 meV for sequence #4, respectively. Theoretical calculation conjunct with experimental measurements confirms that the magnitude of the piezoelectric barrier dominates rectifying effect. The barrier height estimated here agrees well to the electrical energy out from a single ZnO nanowire for NW-based piezoelectric power nanogenerator.

Moreover, mechanical force was applied to control the electric output to determine "1" and "0" states. Each nanowire array corresponds to a device element for memory application. With applied −5 V bias, by applying mechanical force, the operating current ratio of straight and bent ZnO nanowire could be as high as 9.3:1. These two appearance to well-defined "1" and "0" states (OFF and ON states); that is, the shape will be highly sensitive to electric current due to piezoelectricity. A device element could be switched between these "1" and "0" by mechanical force to receive different electric signals. On the basis of this switching mode, one can characterize the elements as nanoscale electromechanical devices.

In summary, nano-manipulation was performed to measure the in-situ I-V characteristics of a single ZnO nanowire. The electric transport was dominated by piezoelectric characteristic of ZnO, which is induced by stain. It has been demonstrated that a single ZnO nanowire can be a rectifier simply by mechanical bending, similar to a p-n junction based diode. To quantify the barrier height produced by piezoelectricity, the I-V characteristics received at different level of the deformation were tied in with theoretical calculation. In addition, under appropriate bending and voltage control, each nanowire array could correspond to a device element for RAM application.

The I-V characteristic of a ZnO nanowire 1620 behaves like a rectifier under bending, which is interpreted with the consideration of a piezoelectricity-induced potential energy barrier at the conductive tip 1632 and the ZnO interface. Under appropriate bending and voltage control, each nanowire 1620 could correspond to a device element for random assess memory, diode and force sensor.

Figure 17:
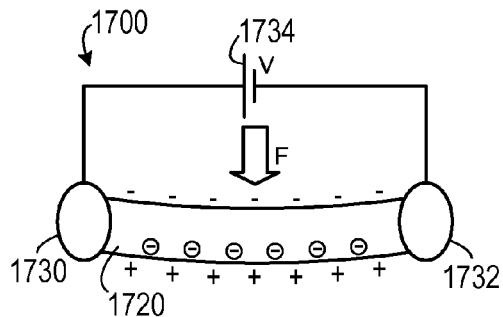
FIG. 17 is a schematic diagram of a nanowire configured to act as a force-gated device.

In one embodiment, as shown in FIG. 17, a nano-scale gated electronic device 1700 corresponding to a field effect transistor (FET) may be made using a piezoelectric nanowire 1720, without using the gate electrode. By connecting a ZnO nanowire 1720 across two electrodes 1730 and 1732 that can apply a bending force to the nanowire 1720, the electric field created by piezoelectricity across the bent nanowire 1720 serves as the gate for controlling the electric current flowing through the nanowire 1720, when the electrodes 1730 and 1732 are coupled to a voltage source 1734. This piezoelectric-field effect transistor (PE-FET) can be turned on/off by applying mechanical force (F). In one experimental embodiment, it has been demonstrated as force sensor for measuring forces in nano-Newton range and even smaller.

In the experimental embodiment, experimental measurement was carried out in-situ in the chamber of a scanning electron microscope (SEM). Inside the SEM chamber, an x-y mechanical stage with a fine moving step of ~50 nm was located beside the SEM sample stage. The mechanical stage can be controlled independently from the outside of the SEM. A tungsten needle with a machined and polished tip was attached on the stage and connected to the positive electrode of an external power source. ZnO nanowires were synthesized by the well established technique of thermal evaporation in a tube furnace. A single nanowire sample was prepared by aligning the nanowire on the edge of a silicon substrate using a probe station. The extended length of the nanowire was ~100 μm, while the other side of the nanowire was fixed onto the silicon substrate by conductive sliver paint, through which the nanowire was connected to the negative electrode of the power source. The silicon substrate was placed on the sample stage with the nanowire pointing at the tungsten needle tip. Both the silver paint and W have ohmic contact with ZnO. When the required vacuum was achieved in the SEM chamber, the tungsten needle tip was first moved to the center of the image screen. The ZnO nanowire was then controlled to approach the needle tip by controlling the SEM stage. Focusing the nanowire and the needle tip at the same time guaranteed that they were aligned at the same height level.

Before making the contact, the ZnO nanowire 1720 was examined under the SEM at a higher resolution. The length of the suspension part of the nanowire was 88.5 μm. The tip of the nanowire 1720 was flat and clean and the faceted side surfaces could be clearly observed. The width of this nanowire 1720 was measured to be 370 nm. TEM analysis revealed the single crystal structure of the ZnO nanowire and the growth direction was along [0001].

In order to achieve a good electrical contact between the ZnO nanowire 1720 and the tungsten tip, a field emission process was introduced at the first stage to clean the nanowire 1720 tip and welding the connection. During the field emission, the ZnO nanowire 1720 was kept at ~10 μm away from the tungsten surface, where a 400 V was applied. Under this condition, the emission current could reach as high as ~1 μA. After 1-minute emission, the high voltage was turned off and the ZnO nanowire 1720 was quickly moved toward the tungsten surface to make a contact. This process was repeated several times and it was found to be effective for making the ohmic contact, possibly due to the high temperature generated at the tip by the emission process as well as the desorption of the surface contaminant.

Figure 18:
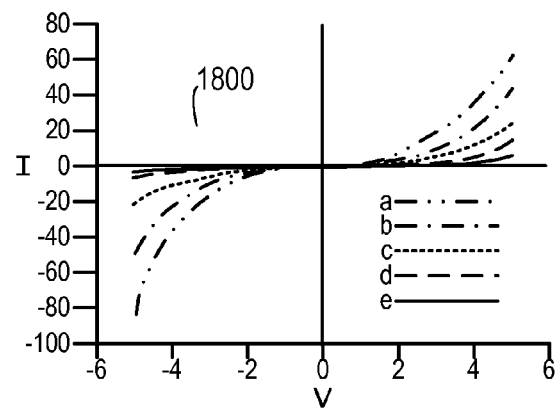
FIG. 18 is a current-voltage diagram for the device shown in FIG. 17A for several different force levels.

In the first contact of the nanowire 1720 with the W tip, the nanowire 1720 was already bent a little bit because a pushing force was necessary for a good electrical contact. Then, the electron beam of the SEM was turned off and the I-V characteristic was measured by sweeping the voltage from −5 to 5 V. This is to eliminate the effect from the electron beam in SEM. After the measurement, the electron beam was turned back on again and the nanowire was bent further by moving the SEM stage in-situ under direct imaging. The bending of the nanowire 1720 was recorded. Following such a procedure, a sequential measurement was carried out. The five typical bending curvatures of the ZnO nanowire 1720 and their corresponding I-V curves 1800 are shown in FIG. 18. The symmetric shape of the I-V curves indicates good ohmic contacts at the both ends of the nanowire 1720. Among the five bending cases, the current dropped significantly with the increasing of bending (curves b to e), indicating the decreased conductance with the increased strain.

Returning to FIG. 17, this phenomenon was further confirmed by continuously changing the bending curvature under SEM observation. In this measurement, the applied voltage was fixed at +5 V and the current was continuously recorded while the ZnO nanowire 1720 was pulled back from large bending to almost straight and then pushed down again. When the nanowire was under significant compression, the current was only ~5 nA (stage I in FIG. 3a). As the nanowire 1720 was slowly released and recovered its straight shape, the current increased continuously with the decreasing of bending curvature, and the current was stabilized at ~40 nA. The current dropped immediately when the nanowire 1720 was bent further. This reveals a reversible sequence that the current passing through the ZnO nanowire 1720 at a fixed voltage was approximately inversely proportional to its bending curvature. Higher magnification SEM images were also taken at the contacting point when the nanowire was straight and highly bent. The nanowire 1720 was firmly attached to the tungsten needle surface without sliding, indicating the contacting was well retained during bending process and should not cause any change in contact resistance.

Examining the mechanisms that are responsible for the change of conductance, when a semiconductor crystal is under strain, the change in electrical conductance is normally referred to as piezoresistance effect, which is usually caused by a change in band gap width as a result of strained lattice. The change of resistance is given by:

$$\delta\rho/\rho = \pi \cdot \delta l/l$$

where ρ is the resistance; l is the original length; and π is the piezoresistance coefficient. This equation is for a case of a crystal that is subjected to a homogeneous strain. Practically, in order to achieve a detectable change in resistance, a semiconductor strain sensor is normally affixed to the surface of the object, of which the strain is to be measured. The built up strain in the object is equivalently picked up by the semiconductor slab, which is either stretched or compressed homogeneously through its entire volume.

However, in our experiment, the strain in the bent ZnO nanowire 1720 is not homogeneous across its cross-section. Finite element analysis was used to simulate the strain distribution in a bent nanowire 1720 with hexagonal cross-section. The calculation was for a nanowire 1720 with aspect ration of 100. After subjecting to a bending, the inner arc surface of the nanowire 1720 is compressed ($\epsilon = \delta l/l < 0$) and the outer arc surface is stretched ($\delta l/l > 0$), and area close to the center of the nanowire 1720 is strain free. This means that, across the cross-section, δl varies linearly from the maximum negative value to the maximum positive value. Moreover, the total piezoresistance of the nanowire is an integration of $\delta\rho/\rho = \pi \cdot \delta l/l$ across the nanowire cross-section and its length. As discussed above, the total piezoresistance of the bent nanowire is close to zero under the first order approximation because of the nearly anti-symmetric distribution of the strain across the width of the nanowire 1720. Therefore, the change in resistance of the nanowire as a result of bending is negligible.

It is important to point out that ZnO is a material that simultaneously has semiconducting and piezoelectric properties. It is worth to examining the coupling between the two properties. A 75% decrease in in-plane conductance of a semiconducting Si slab has been observed when it was sandwiched between two pieces of piezoelectric PZT crystals that were busted by an ac power across the thickness. The drop in the conductance of Si in the direction transverse to the propagation direction of the elastic wave in PZT was attributed to the trapping of free carriers at the surfaces of the silicon plate. This is a result of coupling between a semiconductor Si crystal and a PZT piezoelectric crystal. This coupling effect can now be achieved in a single ZnO nanowire 1720 due to its semiconducting and piezoelectric dual properties.

A bent ZnO nanowire 1720 can produce a positively charged and negatively charged surface at the outer and inner bending arc surfaces of the nanowire due to the stretching and compression on the surfaces, respectively. The charges are induced by piezoelectric effect and the charges are static and non-mobile ionic charges. The local electric field is $E_p = \epsilon/d$, where d is the piezoelectric coefficient. Thus, a small electric field would be generated across the width of the ZnO nanowire. Upon the build up of the electric field, two possible effects can be proposed to account for the reduction of the NW's conductance: carrier trapping effect and the creation of a charge depletion zone.

When the piezo-potential appears across the bent nanowire, some free electrons in the n-type ZnO nanowire may be trapped at the positive side surface (outer arc surface) and become non-movable charges, thus, lowering the effective carrier density in the nanowire. On the other hand, even the positive potential side could be partially neutralized by the trapped electrons, the negative potential remains unchanged. Hence, the piezo-induced electric field is retained across the width of the nanowire. This situation is similar to the case of applying a gate voltage across the width of the ZnO nanowire as for a typical nanowire FET. The free electrons will be repulsed away by the negative potential and leave a charge depletion zone around the compressed side. Consequently, the width of the conducting channel in the ZnO nanowire becomes smaller and smaller while the depletion region becomes larger and larger with the increase of the nanowire bending. These two effects are likely to contribute to the dramatic drop of the conductance of the ZnO nanowire 1720 with the increase of bending. The maximum width that the depletion zone can develop is up to the strain-free plane (close to central axis of the nanowire) with consideration the piezoelectric field, which naturally sets an upper limit to the effect contributed by the depletion charges.

The structure 1700 shown in FIG. 17 is the working principle of a FET except that the gate voltage is produced by piezoelectric effect. Therefore, the single ZnO nanowire 1720 across two ohmic contacts is a piezoelectric-field effect transistor (PE-FET), which is a unique coupling result of the semiconducting and piezoelectric properties of ZnO.

Since the bending curvature of the nanowire is directly related to the force applied to it, a simple PE-FET force/pressure sensor is realized. The important step for calibrating the force/pressure sensor is how to quantitatively determine the force applied to the nanowire 1720. When the nanowire is pressed vertically, under small deflection angle approximation, the nanowire is deflected mainly due to the transverse force $F_y$ and the bending shape of the nanowire is given by:

$$\frac{d^2 y}{dx^2} = \frac{F_y \cdot (L-x)}{YI}$$

where Y is the bending modulus; I is the momentum of inertial; L is the total length of the nanowire 1720. The shape of the bent nanowire 1720 is $$y = \frac{F_y}{YI}\left(\frac{1}{2}Lx^2 - \frac{1}{6}x^3\right)$$

At the tip of the nanowire (x=L), the maximum deflection of the nanowire is $$y_m = \frac{F_y L^3}{3YI}$$

or $$F_y = \frac{3YI y_m}{L^3}$$

The bending modulus of ZnO nanowires has been measured to be 109 GPa according to our previous data and I was calculated to be $6.62 \times 10^{-28}$ m$^4$ for this particular nanowire. $y_m$ was measured from the SEM images. Since the SEM image is a projection of the 3D structure, in order for an accurate measurement, the bending curve should be parallel to the projecting screen. Considering this effect, the tungsten needle surface was tilted 15° to the right-hand side and the initial bending was achieved by lateral moving of the nanowire instead of directly pushing downwards. After parallel bending the nanowire, the stage was then pushed downward to achieve further bending, which can be kept in the same plane. Since the nonlinear I-V characteristics, the conductance was determined by the current measured at a constant 5 V potential. At small bending, the decrease of conductance was almost linear to the bending force.

With the increase of bending at higher transverse force (17 nN), the dropping tendency of the conductance was reduced. This can also be understood from the two processes. At the beginning of bending, both contributions from the carrier trapping effect and the depletion zone increased with the bending curvature, thus producing a quick drop of the conductance. However, unlike the normal gate controlled FETs, there was a positive potential on the outer side of the nanowire 1720, which increased simultaneously with the negative potential at the inner side during the bending. The depletion region cannot extend beyond the neutral plane of the nanowire to the positive potential side. Thus, when the nanowire 1720 was bent to a significant degree, the piezoelectric field could not increase the size of the charge depletion zone, hence, cannot reduce the size of the conduction channel.

The calculations above generally assume a nanowire that is subject to a small degree of bending. A non-linear effect has to be included if the degree of bending is large. This may cause significant change in the calibration of the measured force at larger applied forces. For practical application as force sensors, the measurements are recommended to be carried out under small deflections.

Figure 19A:
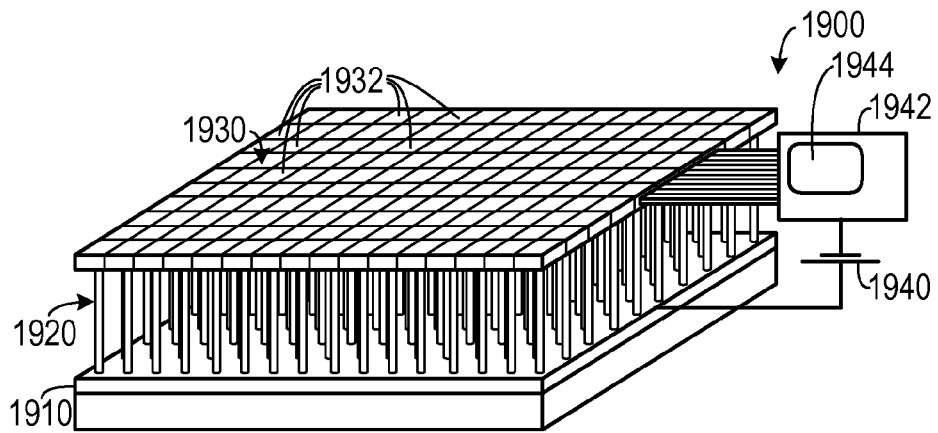
FIG. 19A is a schematic diagram of a device that measures both pressure and location of an object placed against the device.
Figure 19B:
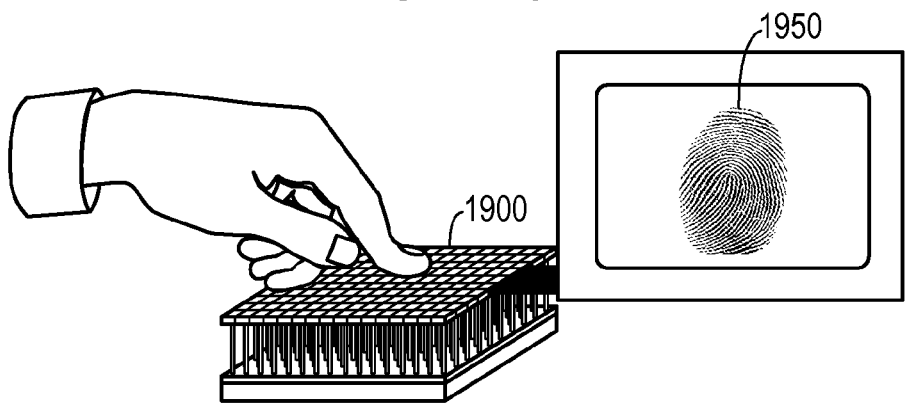
FIG. 19B is a schematic diagram of the device of FIG. 19A configured as a fingerprint sensor.
Figure 19C:
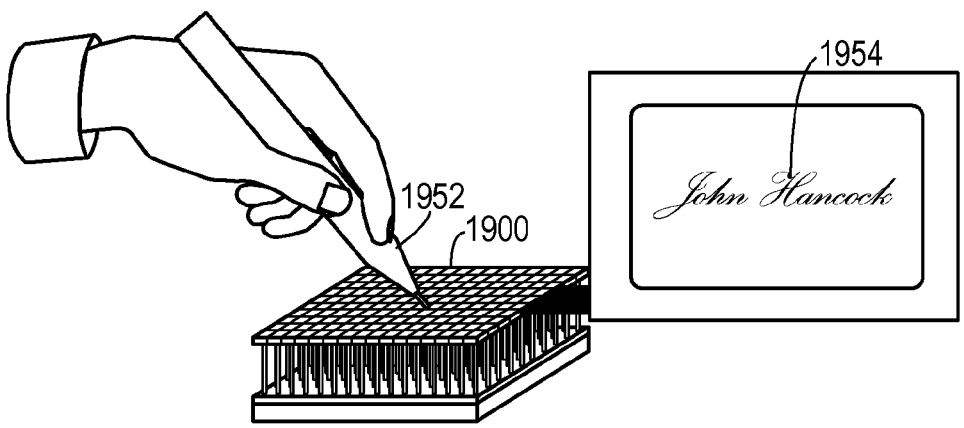
FIG. 19C is a schematic diagram of the device of FIG. 19A configured as a signature sensor that is capable of sensing local pressure of the signature.

One embodiment, shown in FIGS. 19A-19C, is a sensor 1900 that is configured to sense both the amount of force or pressure applied to the sensor 1900 by an object and the location of the object. The sensor 1900 employs a nanowire array 1920 extending upwardly from a substrate 1910. A pixilated electrode layer 1930 that includes an array of conductive and addressable electrodes 1932 (which could be made out of gold or aluminum) affixed to a thin flexible polymer film is placed above the nanowire array 1920. A power source 1940 is coupled to the substrate 1910 and the electrodes 1932 through a current detector 1942. The current detector 1942 may also transmit data to a display 1944, or other type of interface.

By laying the pixel-side of the electrode layer 1930 downwards onto the ZnO nanowire array 1920, an ohmic contact will be formed between the ZnO nanowires 1920 and the electrodes 1932 after annealing. Depending on the spacing of aligned nanowires 1920 and the size of the pixels 1932, one or several nanowires 1920 will connect to each pixel electrode 1932 and independently act as force sensor device. The current detector 1942 is connected to the electrode array 1930 and scans across each pixel electrode 1932 collecting the current signal when a small DC voltage is applied between the bottom electrode substrate 1910 and top pixel electrode array 1930. The sensor 1900 can act as a force imaging device with high sensitivity and resolution, such as high resolution shape recorder As shown in FIG. 19B, the sensor 1900 could be configured to detect fingerprints 1950. Such a configuration could detect not only the location of the stylus 1952, but also the pressure being applied by it. When a finger is pressed onto the flexible top plate, the extrusion of the figure surface will press the polymer film downwards at the contact region, thus bends the nanowires underneath. The bending induced resistance change will reduce the current flowing through those pixels. The current signal from each pixel is colleted by the current monitor and compared with their original value. By converting the current variation into force signal according to the linear relationship, the high resolution shape of the fingerprint can be mapped out.

As shown in FIG. 19C, the sensor 1900 could be used with a stylus 1952 and configured to detect a signature 1954. The sensor 1900 could trace the motion and intensity of force applied by the stylus 1952 so as to record and recognize a digital signature 1954. By keeping the current monitor scanning the pixel array at a relatively high frequency, such as a few kHz, the motion of the stylus 1952 on the top plate can be recorded. Meanwhile, the intensity of the force applied at each point can also be identified through the amplitude of the current signal change. This technique will not only record the image of a signature, but also the writing sequence and corresponding strength. With all of this information, the authenticity of a digital signature would be highly enhanced and could add an additional layer of security in verifying signatures on-line.

One method of making a force sensing sensor is shown in FIGS. 20A-20G. Initially, a plurality of ZnO nanowires 2020 is grown on a single crystal substrate 2010 (such as through a vapor-liquid-solid process. By controlling the thickness of a gold catalyst layer, a continuous ZnO bottom layer 2022 can be formed under the ZnO nanowires 2020 so that all of the nanowires 2020 are electrically connected. A layer 2030 of PMMA is spin coated with a thickness less than the height of the nanowires 2020. A thin layer 2040 of an Al/Au alloy (about 50 nm thick) is deposited on top of the PMMA layer 2030 so as to contact the tops of the nanowires 2020. The size and location of the tip electrode can be controlled by using TEM grids as masks during the deposition process. The PMMA layer 2040 is completely removed by immersing it in a solvent, such as acetone for about 24 hours, or until the layer 2040 is completely removed. The edges are sealed with an insulating material 2050, such as epoxy. The top layer 2040 and the bottom layer are then connected to a current sensor 2060 and may be also coupled to a voltage source 2062.

In this configuration, when external pressure is applied on the top, the electrode layer 2040 will bend down, as shown in FIG. 20G. The ZnO nanowires 2020 will bend also and a potential change will be induced between the top layer 2040 and the bottom conductive layer 2022. A current flow can then be detected by the current sensor 2060. This sensor can be made small (e.g., about 10 square micrometers) and can be implanted in vessels or cells to perform in vivo pressure measurements.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A semiconducting device, comprising:
   a. a substrate;
   b. a piezoelectric wire, having a first end and an opposite second end, disposed on the substrate;
   c. a structure that causes the piezoelectric wire to bend in a predetermined manner between the first end and the second end so that the piezoelectric wire enters a first semiconducting state; and
   d. a first electrode coupled to the first end and a second electrode coupled to the second end so that when the piezoelectric wire is in the first semiconducting state, an electrical characteristic will be exhibited between the first electrode and the second electrode, the device configured as a force-sensitive generator, wherein the electrical characteristic comprises generating charge carriers that flow into the first electrode,
      wherein the piezoelectric wire comprises one of a plurality of zinc oxide nanowires extending upwardly from the substrate and wherein the first electrode comprises a conductive material having a corrugated surface, wherein the corrugated surface is disposed so as to face the substrate with the plurality of zinc oxide nanowires disposed therebetween.

2. The semiconducting device of claim 1, wherein the electrical characteristic comprises allowing current to flow through the wire as a function of an amount that the wire is bent by the structure.

3. The semiconducting device of claim 2, configured as a transistor, wherein the structure is configured to apply force to the piezoelectric wire between the first end and the second end.

4. The semiconducting device of claim 1, wherein the electrical characteristic comprises restricting flow of charge carriers through the piezoelectric wire/metal electrode junction in a first direction and not restriction flow of charge carriers through the piezoelectric wire/metal electrode junction in a second direction opposite the first direction.

5. The semiconducting device of claim 4, configured as a diode, wherein the structure is configured to apply force to the first electrode and the piezoelectric wire so that the first electrode is held against an expanded side of the piezoelectric wire, thereby forming a junction biased so as to restrict charge from flowing from the piezoelectric wire into the first electrode and so as not to restrict charge from flowing from the first electrode into piezoelectric wire.

6. The semiconducting device of claim 1, further comprising a spacer disposed between the substrate and the first electrode that holds the first electrode spaced apart from the substrate.

7. The semiconducting device of claim 6, wherein the spacer comprises a soft packaging material.

* * * * *